(12) United States Patent
Matsushima

(10) Patent No.: US 6,384,485 B1
(45) Date of Patent: May 7, 2002

(54) SEMICONDUCTOR DEVICE

(75) Inventor: Hironori Matsushima, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 16 days.

(21) Appl. No.: 09/606,154

(22) Filed: Jun. 29, 2000

(30) Foreign Application Priority Data

Jan. 18, 2000 (JP) ........................................ 2000-009208

(51) Int. Cl.[7] ................................................ H01L 23/48
(52) U.S. Cl. ........................................ 257/778; 257/774
(58) Field of Search ......................... 361/793; 438/118; 257/778, 700, 690, 737, 774, 779, 781

(56) References Cited

U.S. PATENT DOCUMENTS

| | | | | |
|---|---|---|---|---|
| 5,488,542 A | * | 1/1996 | Ito ................................ | 361/793 |
| 5,863,815 A | * | 1/1999 | Egawa ......................... | 438/118 |
| 5,962,925 A | * | 10/1999 | Eifuku et al. ................ | 257/778 |
| 6,081,026 A | * | 6/2000 | Wang et al. ................. | 257/700 |
| 6,239,485 B1 | * | 5/2001 | Peters et al. ................ | 257/700 |

FOREIGN PATENT DOCUMENTS

| | | |
|---|---|---|
| JP | 5-144971 | 6/1993 |
| JP | 8-64983 | 3/1996 |
| JP | 11-26634 | 1/1999 |

* cited by examiner

*Primary Examiner*—David Nelms
*Assistant Examiner*—Bau T Le
(74) *Attorney, Agent, or Firm*—McDermott, Will & Emery

(57) ABSTRACT

In the present semiconductor device, signal lines of the first signal layer are led to the lower multi-layer portion via through holes selected under certain conditions so that the crosstalk noise does not become a problem even when the second signal layer is superposed on the first signal layer without providing a plane layer therebetween. In addition, a ground plane is provided in the region of the first signal layer lacking signal lines so that the second signal layer is sandwiched by the planes to form a strip structure even without the provision of a separate plane layer between the first signal layer and the second signal layer. Thus, the number of layers required for the multi-layer substrate can be reduced by eliminating this one unnecessary plane layer.

6 Claims, 12 Drawing Sheets

SEMICONDUCTOR DEVICE

BACKGROUND OF THE INVENTION

1. Field of the Invention

The present invention relates to a semiconductor device utilizing a multi-layer substrate having a power-supply plane, a ground plane, and signal lines disposed in layers.

2. Description of the Background Art

One example of a conventional semiconductor device is shown in FIGS. 9 and 10. This semiconductor device is the so-called FCBGA (Flip Chip Ball Grid Array) substrate. In the following, in order to discriminate this FCBGA substrate from a simple substrate portion, the overall package will be referred to as a "FCBGA substrate module" 100. The semiconductor device is provided with a BGA (Ball Grid Array) substrate 101 and a semiconductor chip 102 connected by flip-chip bonding to BGA substrate 101 via a solder bump 105 serving as an electrode. BGA substrate 101 is a substrate having a multi-layer structure, and on its back surface a solder ball 106 serving as an external connection electrode is arranged for providing an electrical connection with the outside. An encapsulation material 104 fills between BGA substrate 101 and semiconductor chip 102 in order to improve the reliability of the bonding between the two. In addition, above semiconductor chip 102, a heat spreader 107 is provided with a resin for heat radiation 108 provided therebetween in order to radiate the heat generated from semiconductor chip 102 to the outside. Resin for heat radiation 108 is provided to help the heat radiation from semiconductor chip 102 to heat spreader 107. A ring 103 is provided surrounding semiconductor chip 102 in order to maintain a prescribed distance between BGA substrate 101 and heat spreader 107 as well as to provide strength to the overall package.

Moreover, to facilitate the understanding of the internal structure, FIG. 9 shows heat spreader 107 partially cut away. In addition, FIGS. 9 and 10 are schematic diagrams whose dimensional ratio is exaggerated and which represent fewer numbers of solder bumps 105 and solder balls 106 than are actually present for greater clarity.

FIG. 11 shows, in enlargement and in further detail, the portion corresponding to the left half of FIG. 10. A multi-layered BGA substrate 101 is provided with plane layers 10 and 11 having copper planes 13 and 14 formed by plating on either surface of a core layer 8 formed of a BT (Bismaleimd Triazine) resin, for instance, and is formed by a plurality of layers further provided evenly on both outer surfaces of plane layers 10 and 11. For convenience, the portion of the plurality of layers above core layer 8 will be referred to as an "upper multi-layer portion," and the portion below core layer 8 will be referred to as a "lower multi-layer portion." Within the upper multi-layer portion and the lower multi-layer portion, a signal layer 9, a power-supply plane layer 10, and a ground plane layer 11 are inserted in a certain order at substantially even intervals. Each of these inserted layers will be referred to as a "component layer."

Signal layer 9 is provided mainly for the laying of a signal line 12 in the lateral direction, i.e., the so-called "routing." Power-supply plane layer 10 is provided mainly for the disposition of a power-supply plane which is a conductor plane for supplying power. Ground plane layer 11 is provided mainly for the disposition of a ground plane which is a grounded conductor plane.

Solder bumps 105 serving as electrodes for semiconductor chip 102 can be categorized into two kinds based on the function: a signal-related solder bump 105a and a non-signal-related solder bump 105b. Signal-related solder bump 105a is for communicating a signal and is electrically connected to one of solder balls 106. Non-signal-related solder bump 105b is normally connected to a power-supply plane 13 or a ground plane 14.

Signal-related solder bump 105a must be connected to a solder ball 106 via the upper multi-layer portion, core layer 8, and the lower multi-layer portion. The connection in the lateral direction in the same layer is provided by routing of signal line 12, and the connection to a lower layer is provided through a via hole 17.

When disposing signal lines 12 in one signal layer 9, as a rule, the so-called strip structure is employed, where signal layer 9 is sandwiched between plane layers in order to prevent the crosstalk noise between an upper and a lower signal lines 12. Therefore, as shown in FIG. 11, when the uppermost component layer is a first signal layer 9, ground plane layer 11 which is one kind of plane layer is disposed as the component layer under the uppermost component layer. Under ground plane layer 11 a second signal layer 9 is disposed, and thereunder, power-supply plane layer 10 which is one kind of plane layer is disposed.

In this example of the FCBGA substrate module, solder bumps 105 are disposed substantially in a belt-like shape only in the peripheral portion on the bottom surface of semiconductor chip 102. The number of rows of signal-related solder bumps 105a counted in the width direction of the band is six to seven. Signal-related solder bump lands 16a serving as chip electrode lands for these electrodes are disposed in a similar manner. Signal-related solder bump lands 16a must be connected to the respective solder balls 106 via certain paths. The manner of connection will be described in relation to FIGS. 12 to 14. FIGS. 12 and 13 represent the signal flow by means of symbols. A plurality of signal lines 12 within one component layer extend two-dimensionally from the foreground to the depth direction of the sheet so that signal lines 12 do not actually appear in plurality in the same cross section. In the drawings, however, the plurality of signal lines 12 are represented in parallel within one layer for clarity. FIG. 14 is a schematic diagram corresponding to a plan view of the uppermost signal layer 9 in FIGS. 11 and 12 seen from above.

As shown in FIGS. 12 and 14, two to three rows starting from the outer side of the rows of signal-related solder bump lands 16a are assigned to each signal layer 9, and signal lines 12 are routed from a projected region 102c (see FIG. 14) of semiconductor chip 102 outward in one signal layer 9. Signal line 12 must pass through one of the through holes 15 to be connected to one of the solder balls 106. While the disposition pitch of the interconnection lines in each component layer is such that the minimum required distance between the outer edges of the interconnection lines is several tens in $\mu$m, the arrangement pitch of through holes 15 is such that the center distance is approximately 800 $\mu$m, which is many times coarser. Therefore, as shown in FIG. 14, any given signal line 12 extending outward from projected region 102c is routed to the vicinity of the position corresponding to the target solder ball 106 within signal layer 9, and is connected to the lower layers through via hole 17 and through hole 15. Since the above given signal line 12 and another signal line 12 extending from a signal-related solder bump 16a closer to the inner side must use different through holes 15, and since cluttering of the interconnection lines should be avoided, a signal line 12 extending from a signal-related solder bump 16a closer to the outer side passes through a through holes 15 farther away from projected region 102c.

On the other hand, signal-related solder bumps 16a, not having which signal lines 12 routed outward from projected region 102c within signal layer 9, are connected from this signal layer 9 to a signal layer 9 of a lower layer through via holes 17. Once the connection reaches the signal layer 9 assigned to the above signal-related solder bumps 16a, it is routed in the lateral direction by signal lines 12.

As shown in FIGS. 12 and 13, in this example, the connections from all signal-related bumps are shared by and allotted to the total of three signal layers 9 in the upper multi-layer portion and the lower multi-layer portion combined. At this time, due to the need to maintain the above-described strip structure and to the symmetrical formation of the upper multi-layer portion and the lower multi-layer portion with core layer 8 in the center, eight component layers are required including the lowermost layer in which solder balls 106 are provided.

In addition, only the signal lines 12 corresponding to two to three rows of signal-related solder bump lands 16a can be routed per signal layer, because, as shown in FIG. 14, signal-related solder bump lands 16a themselves are disposed in a congested manner, and non-signal-related solder bump lands 16b are disposed outside signal-related solder bump lands 16a so that signal lines 12 must be arranged in the limited area so as to circumvent non-signal-related solder bump lands 16b in order not to interfere with the latter.

As shown in FIG. 11, interconnection lines are provided from non-signal-related solder bump lands 16b toward power-supply plane 13 or ground plane 14 within the same component layer or in other component layers. Such interconnection lines are not shown in FIG. 12. Signal lines 12 must be routed such that they thread their way through these interconnection lines, maintaining a distance greater than a certain distance at all times.

In such a semiconductor device, reduction in the number of component layers employed for the upper multi-layer portion and the lower multi-layer portion is desired in order to decrease the number of manufacturing steps for multi-layer substrate 101 and to reduce the production cost. Unless the arrangement for signal-related solder bumps 105a is changed, however, three signal layers 9 are required in this example in order to effect the routing of signal lines 12 from all signal-related solder bump lands 16a. Moreover, the strip structure must be maintained in order to prevent the crosstalk noise.

Thus, the object of the present invention is to provide a semiconductor device having a fewer number of component layers required for multi-layer substrate 101 while maintaining the conventional arrangement of signal-related solder bumps 105a.

SUMMARY OF THE INVENTION

In order to achieve the above object, the semiconductor device according to one aspect of the present invention is provided with a multi-layer substrate, a semiconductor chip provided above the multi-layer substrate, and external connection electrodes provided below the multi-layer substrate. The multi-layer substrate is provided with a core layer having a plurality of through holes for electrically connecting the upper side with the lower side, an upper multi-layer portion provided above the core layer, a lower multi-layer portion provided below the core layer, a plurality of chip electrode lands provided on an upper surface of the upper multi-layer portion to be electrically connected to the electrodes of the semiconductor chip, and a plurality of signal lines for electrically connecting the chip electrode lands respectively to the external connection electrodes. The upper multi-layer portion and the lower multi-layer portion are each formed by a plurality of component layers, and include via holes for electrically connecting the signal lines belonging to different component layers. The plurality of component layers include a signal layer provided mainly for the routing of the signal lines within each same layer to desired positions in plan view, and plane layers provided mainly for the disposition of conductor planes which sandwich the signal layer. The signal layer in the upper multi-layer portion includes a first specific signal layer and a second specific signal layer provided adjacent to and below the first specific signal layer without the plane layer provided therebetween. The signal lines extending from within the projected region of the semiconductor chip toward outside the projected region in the first specific signal layer are routed to the via holes leading to the respectively selected through holes such that the longest distance of the signal lines extending in the first specific signal layer becomes the shortest possible, and are connected to the lower multi-layer portion via the through holes, and further are routed to the via holes leading to the external connection electrodes to which the signal lines are to be connected. The signal lines extending from within the projected region of the semiconductor chip toward outside the projected region in the second specific signal layer are routed to the via holes leading to the through holes which are closest to the external connection electrodes to which the signal lines are to be connected when seen from the above, and are connected to the lower multi-layer portion via the through holes. A conductor plane is provided in the region other than the portion in which the signal lines are disposed in the first specific signal layer.

With the above-described arrangement, the signal lines of the first specific signal layer are not routed within the first specific signal layer but are connected to the lower multi-layer portion via through holes selected under certain conditions so that the extra room that is conventionally found in the signal layer of the lower multi-layer portion can be effectively utilized for the routing of the signal lines. In addition, the signal lines are only extended for substantially the minimum distance within the first specific signal layer so that the crosstalk noise with the second specific signal layer does not form a problem, and thus, the plane layer between first signal layer 9 and second signal layer 9 can be eliminated. As a result, the number of layers of the multi-layer substrate can be reduced.

According to the present invention, the first specific signal layer preferably is the component layer which is the uppermost of the upper multi-layer portion. By adopting this arrangement, the number of layers can be further reduced even in the multi-layer substrate having a fewer number of layers.

More preferably, the present invention is provided with an external terminal land electrically connected with a plane, and the connection between the plane and the external terminal land is provided in parallel through a plurality of via holes. By adopting this arrangement, the voltage can be supplied to the plane in a stable manner, and the reliability of the entire semiconductor device can be improved since the device can operate with stability even when one of the connections proves faulty.

According to another aspect of the present invention, the semiconductor device is provided with a multi-layer substrate, a semiconductor chip provided above the multi-layer substrate, and external connection electrodes provided below the multi-layer substrate, and the multi-layer substrate includes a core layer having a plurality of through holes for electrically connecting the upper side with the lower side, an upper multi-layer portion provided above the core layer, a lower multi-layer portion provided below the core layer, a plurality of chip electrode lands provided on an upper surface of the upper multi-layer portion to be electrically connected with electrodes of the semiconductor chip, and a plurality of signal lines for electrically connecting the chip electrode lands respectively with the external connection electrodes. The upper multi-layer portion and the lower multi-layer portion are each formed by a plurality of component layers, and include via holes for electrically connecting the signal lines belonging to different component layers. A land for receiving a conductor to be electrically connected from above is formed such that, when seen from the above, the distance between the center of a circle circumscribed about the land and the outer edge of the land facing an adjacent interconnection line is shorter than the distance between the center and the outer edge of the land in other areas.

By adopting this arrangement, the land would have the cut-away shape, and the gap can be ensured even when adjacent interconnection lines are disposed closer so that the higher density of the interconnection lines can be achieved while the necessary distance from an interconnection line is reserved.

According to the present invention, the land preferably is a chip electrode land. By adopting this arrangement, the higher density of the chip electrode arrangement can be achieved.

According to the present invention, the land preferably is a via land serving as a receiving portion for the via hole. By adopting this arrangement, the higher density in disposing via holes or signal lines in each component layer can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
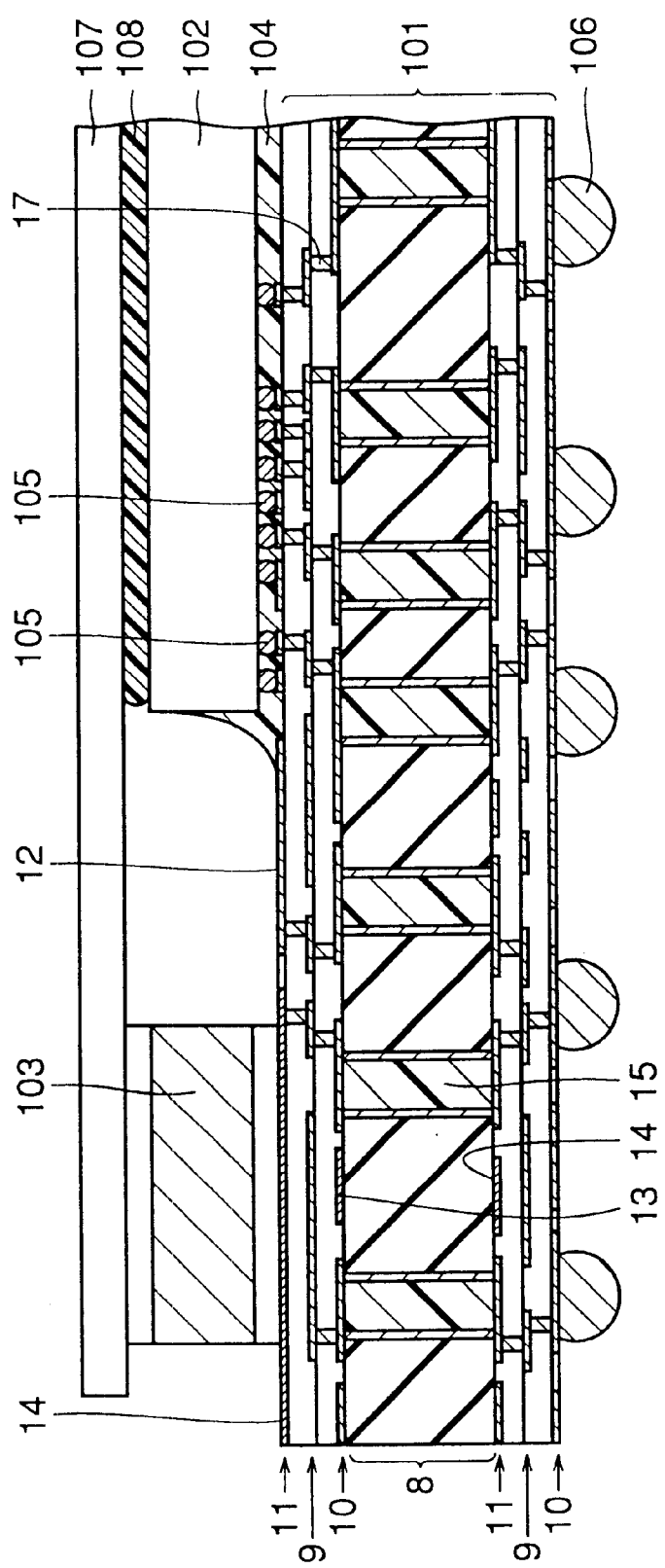
FIG. 1 is a cross sectional view of a portion of a FCBGA substrate module according to a first embodiment of the present invention.
Figure 12:
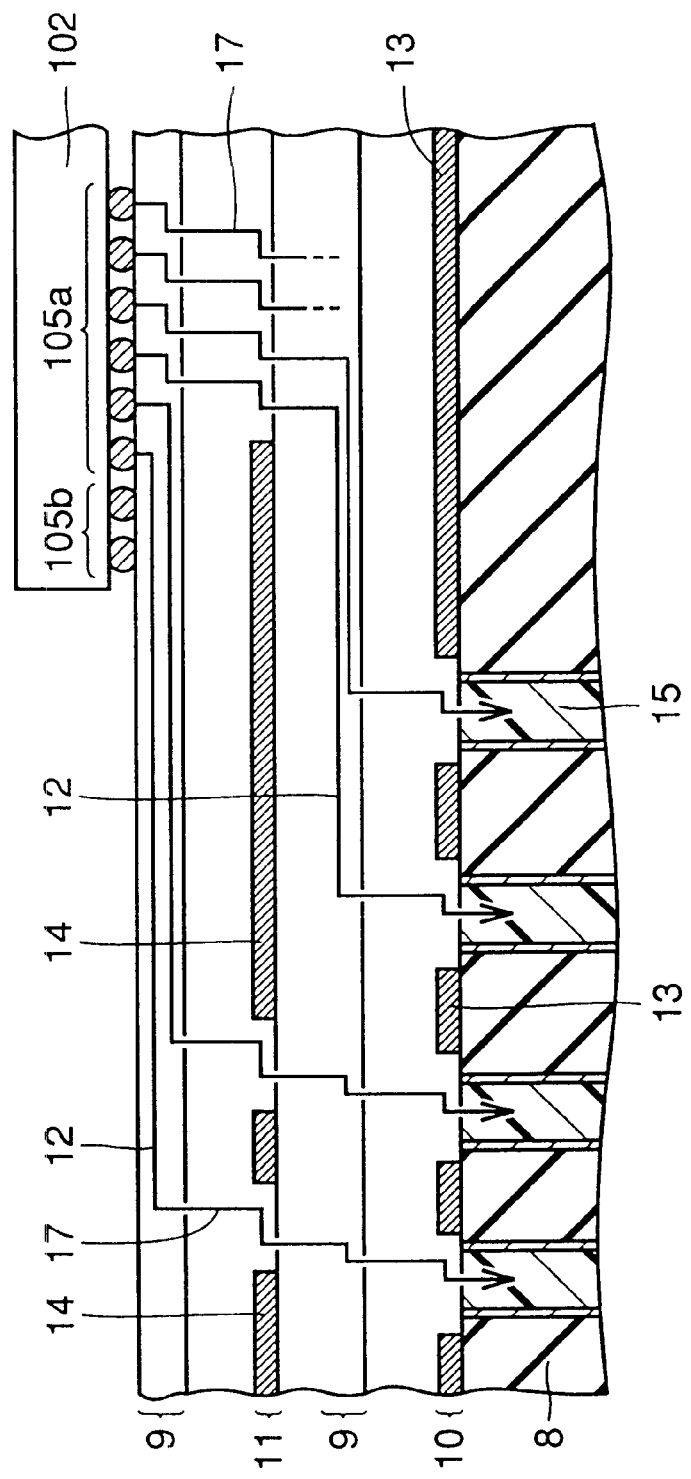
FIGS. 12 and 13 are schematic diagrams representing the signal flow in a cross section of a portion of the conventional FCBGA substrate module.
Figure 13:
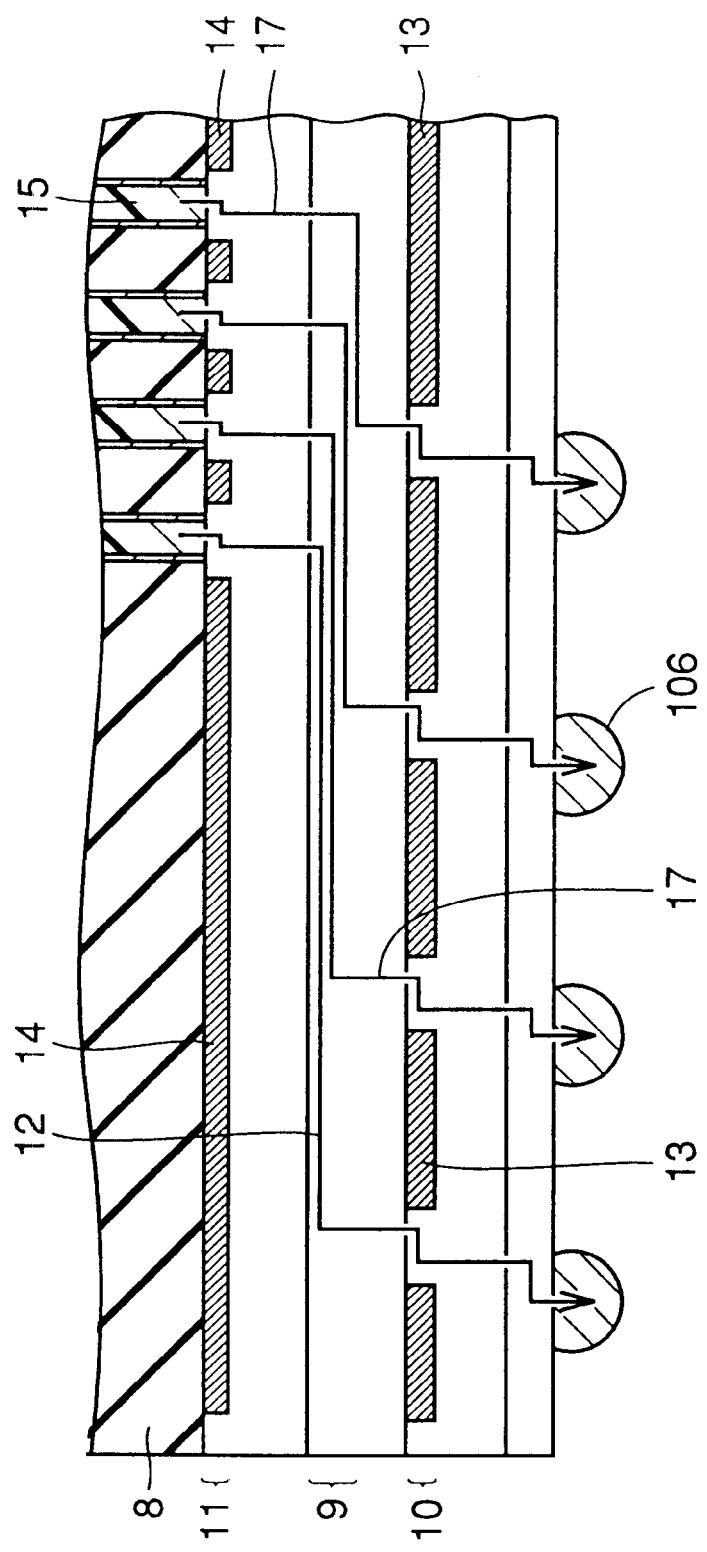
Figure 14:
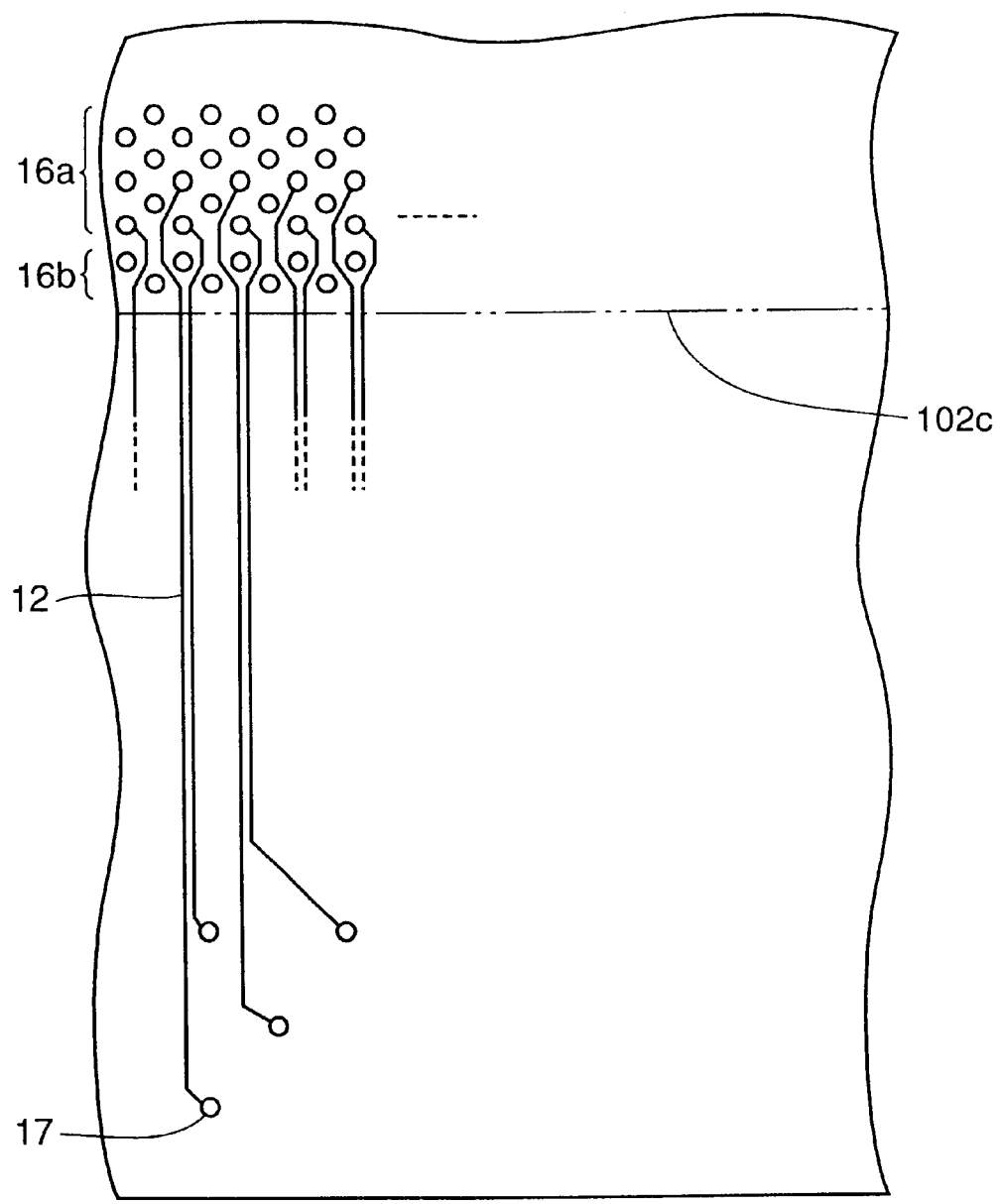
FIG. 14 is a plan view of a portion of the conventional FCBGA substrate module.

The structure of the semiconductor device according to the first embodiment will be described in relation to FIG. 1. The manner of connection is shown in detail in FIGS. 2 to 5. Signal-related solder bump lands 16a are arranged in the same manner as shown in FIGS. 12 to 14. Like the conventional example, two to three rows starting from the outer side of the rows of signal-related solder bump lands 16a are assigned, as a set, to each signal layer 9.

Figure 2:
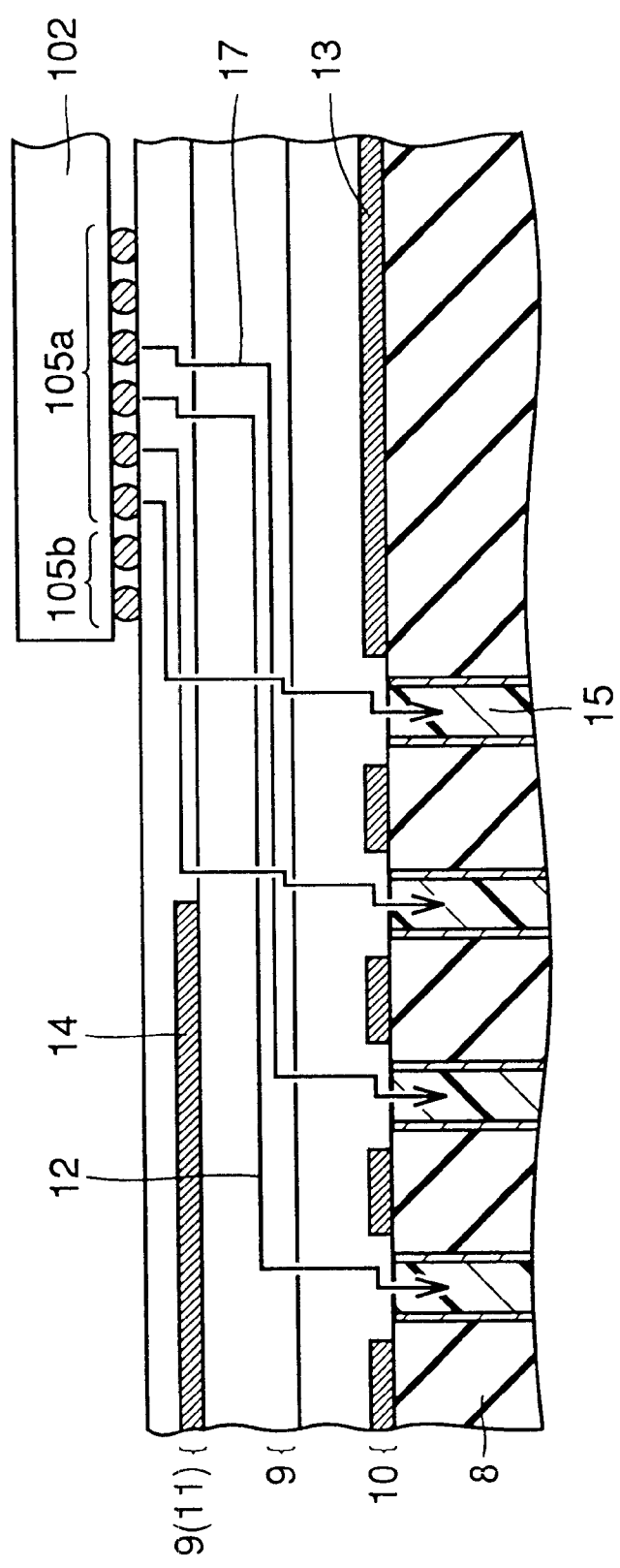
FIGS. 2 and 3 are schematic diagrams representing the signal flow in a cross section of a portion of the FCBGA substrate module according to the first embodiment of the present invention.

As shown in FIG. 2, in the uppermost signal layer 9 (hereinafter referred to as a "first signal layer 9"), a signal line 12 is not routed to the vicinity of the position corresponding to the target solder ball 106 within first signal layer 9 but is first routed outward from a projected region 102c of a semiconductor chip 102, and thereafter is connected to a via hole 17 corresponding to a through hole 15 selected under certain conditions. The "through hole 15 selected under certain conditions" more specifically refers to the through hole 15 selected where signal lines 12 are distributed such that signal lines 12 do not interfere with one another and the distance of the longest signal line 12 of all signal lines 12 laid in first signal layer 9 becomes the shortest possible.

Figure 5:
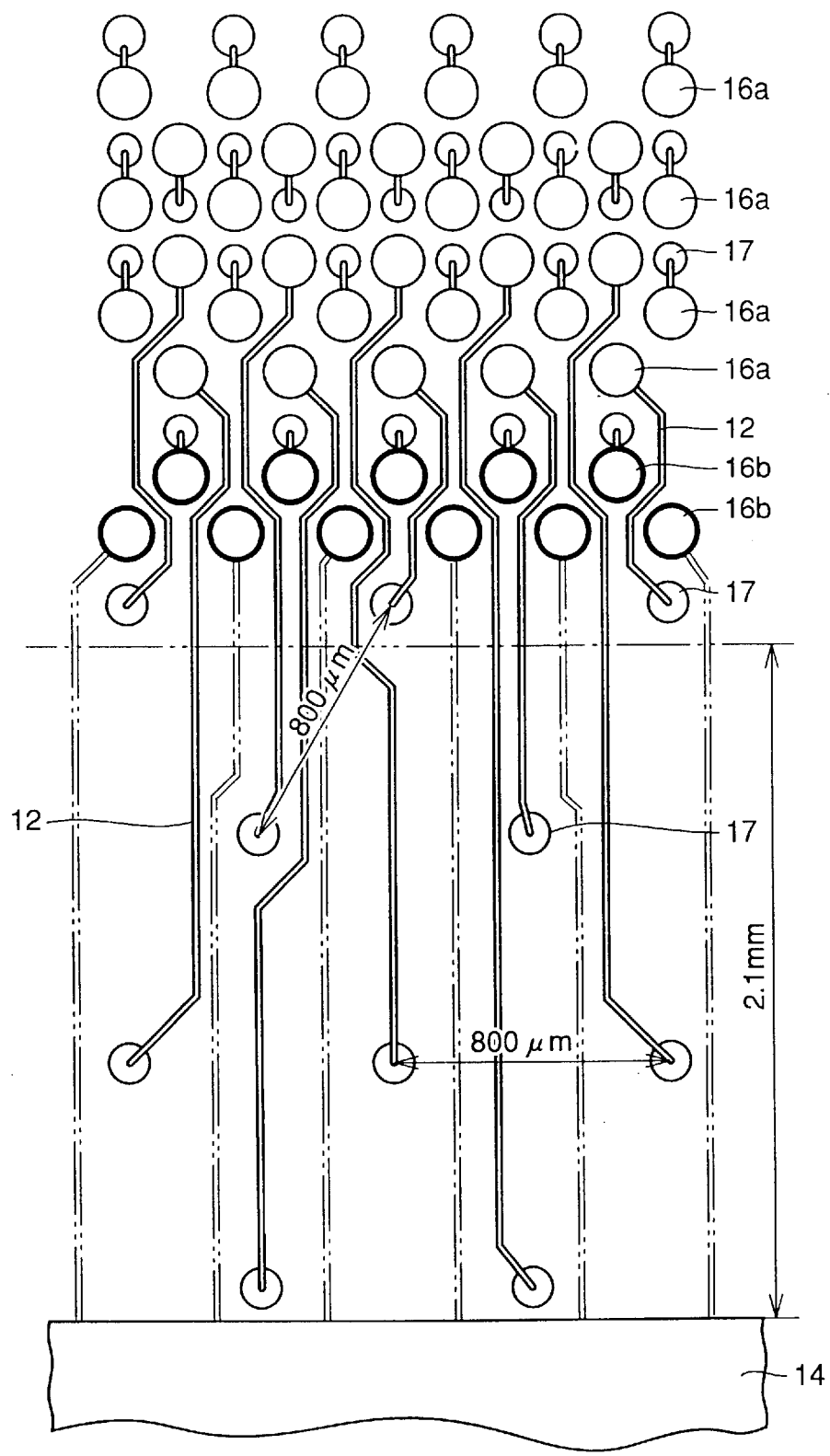
FIG. 5 is an enlarged view of a portion in FIG. 4.

One example of such distribution of signal lines 12 is shown in FIG. 5. In this example, a core layer 8 is employed in which the arrangement pitch of through holes 15 is coarse so that the center distance is 800 $\mu$m. In effect, however, the routing of signal lines 12 is accommodated within the range of 2.1 mm from projected region 102c of semiconductor chip 102.

Figure 3:
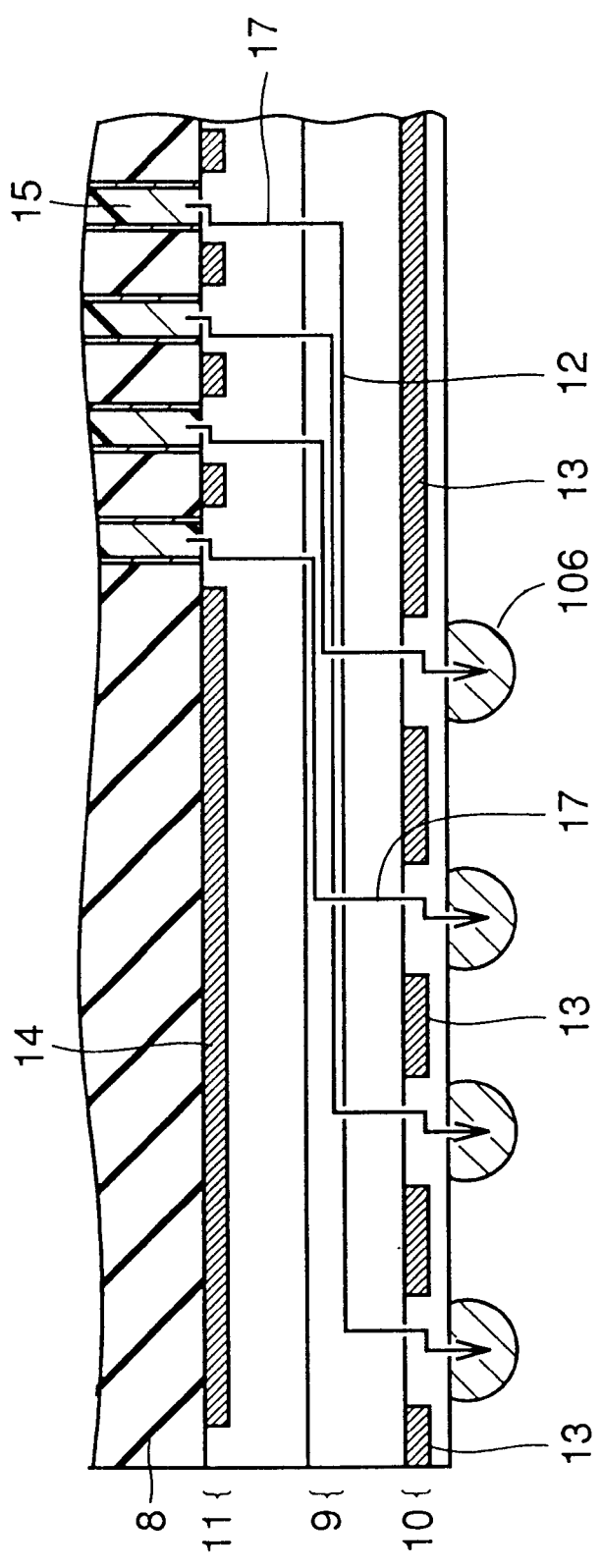

An interconnection line thus connected to a via hole 17 reaches the lower multi-layer portion through via hole 17 and a through hole 15. As shown in FIG. 3, in a signal layer 9 of the lower multi-layer portion (hereinafter referred to as a "third signal layer 9"), the interconnection line extends to the position corresponding to the target solder ball 106, and thereafter is connected to solder ball 106 through a via hole 17.

Figure 4:
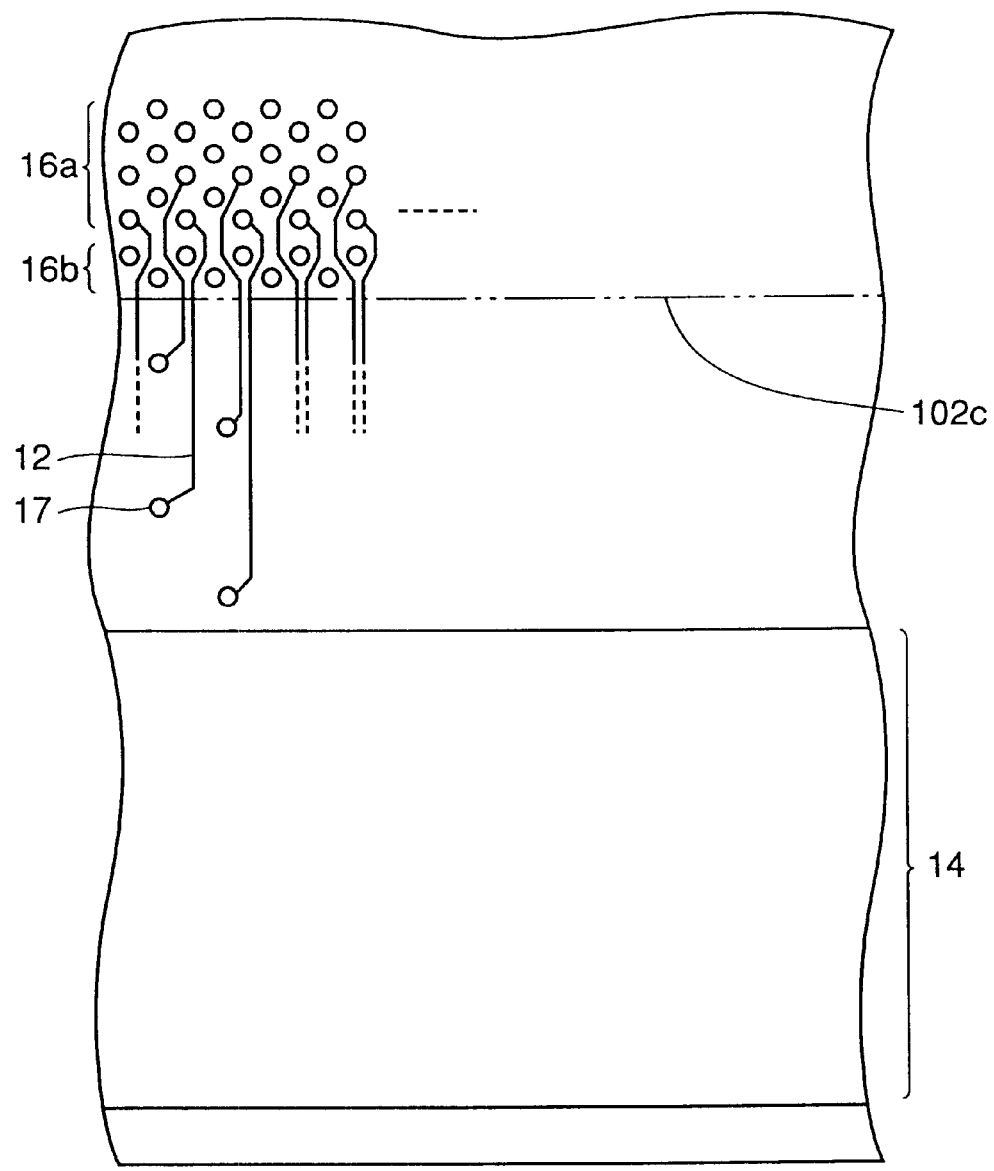
FIG. 4 is a plan view of a portion of the FCBGA substrate module according to the first embodiment of the present invention.

FIG. 4 shows a plan view in which first signal layer 9 is seen from above. As shown in FIGS. 2 and 4, the routing distance of signal line 12 within first signal layer 9 is shorter in comparison with the conventional example (FIGS. 12 and 14), a ground plane 14 is disposed in the portion of first signal layer 9 lacking signal lines 12. Thus, first signal layer 9 is a ground plane layer 11 at the same time. A power-supply plane instead of ground plane 14 may be provided in the first signal layer.

As in the conventional example, signal-related solder bump lands 16a allotted to the signal layer (hereinafter referred to as a "second signal layer") provided under the first signal layer without a plane layer provided therebetween are routed to the positions corresponding to the target solder balls 106 within second signal layer 9, and are connected to the lower multi-layer portion through via holes 17 and through holes 15.

The signal lines of first signal layer 9 are not routed within a first signal layer 9 but are connected to a third signal layer 9 in the lower multi-layer portion via through holes 15 selected under certain conditions, and are routed toward the target solder balls 106 in third signal layer 9 of the lower multi-layer portion. As a result, the extra room conventionally found in third signal layer 9 can be effectively utilized for the routing of signal lines 12.

In addition, although the signal lines extending to the positions corresponding to through holes 15 in first signal layer 9 and signal lines 12 of second signal layer 9 overlap without the plane layer provided therebetween, since through holes 5 are selected under certain conditions, the overlapping distance is limited substantially to the minimum so that the crosstalk noise in this area does not cause a problem. Therefore, the plane layer between first signal layer 9 and second signal layer 9 can be eliminated, allowing the reduction in the number of layers in multi-layer substrate 101.

Moreover, as shown in FIG. 13, signal lines 12 originally allotted to third signal layer 9 and signal lines 12 that enter into third signal layer 9 via through holes 15 from first signal layer 9 coexist within third signal layer 9. In third signal layer 9, however, only short portions of the interconnection lines from non-signal-related solder bump lands 16b reside, and signal lines 12 are already spread out over a wide range so that extra room is available for the disposition of the interconnection lines, and the interconnection lines can be laid without the inconvenience experienced in first signal layer 9.

Like the first signal layer according to the present embodiment, the signal layer led to the lower multi-layer portion via through holes selected under certain conditions will be hereinafter referred to as a "first specific signal layer," and the signal layer provided below the first specific signal layer without a plane layer provided therebetween will be referred to as a "second specific signal layer." The first specific signal layer is preferably the uppermost component layer as in the present embodiment, but is not so limited. A component layer other than the uppermost component layer may form the first specific signal layer, and in this case, the first specific, signal layer and the second specific signal layer can be provided, with the former on top of the latter, without providing a plane layer therebetween so that the number of layers in the multi-layer substrate can be reduced.

In addition, in the present embodiment, three signal layers 9 including the first signal layer to the third signal layer are described. The number of signal layers 9 is set to three only for illustration, and the present invention is equally applicable even when the number of signal layers 9 is other than three and is at least two.

Furthermore, the present embodiment employs core layer 8 in which the arrangement pitch of through holes 15 is coarse such that the center distance is 800 µm. If, however, the arrangement pitch of through holes 15 in core layer 8 is reduced and is brought closer to the arrangement pitch of signal-related solder bump lands 16a, signal-related solder bumps 105a can be disposed not only in the peripheral portion of semiconductor chip 102 but also in its central portion so that semiconductor chip 102 can be significantly reduced in size. As a result, miniaturization of the overall semiconductor device becomes possible.

Second Embodiment

Figure 6:
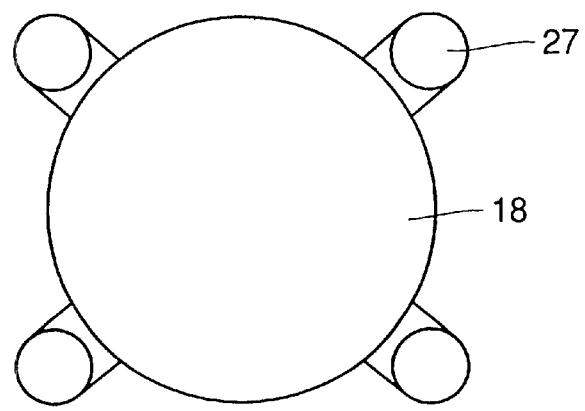
FIG. 6 is a plan view of the periphery of an external terminal land of the FCBGA substrate module according to a second embodiment of the present invention.

As shown in FIG. 6, the interconnection for an external terminal land 18 is provided in a FCBGA substrate module. More specifically, via lands 27 are provided in plural locations for one external terminal land 18 to provide connection with power-supply plane 13 or ground plane 14. The arrangement of other portions is the same as in the first embodiment.

With such connections, the power-supply voltage for power-supply plane 13 or the ground voltage for ground plane 14 can be supplied more stably, and the supply would not be cut off even when one of the connections is defective or damaged so that a prescribed operation can continue, thereby improving the reliability of the overall semiconductor device.

Third Embodiment

Figure 7:
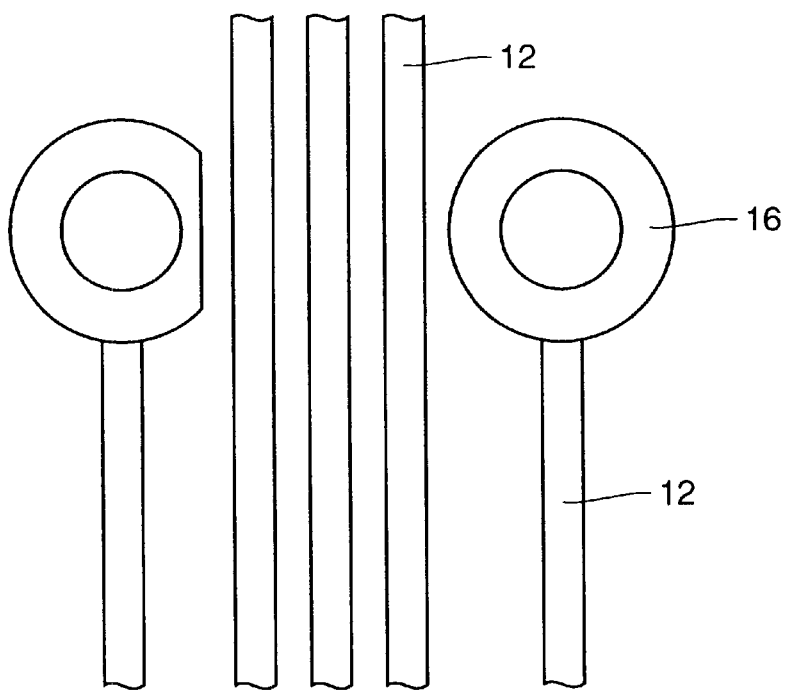
FIGS. 7 and 8 are plan views of the periphery of a solder bump land of the FCBGA substrate module according to a third embodiment of the present invention.

When providing a signal line 12 as an interconnection line in a gap between solder bump lands 16 serving as chip electrode lands, a portion of a solder bump land 16, originally of a circular shape, is cut away, as shown in FIG. 7. In other words, solder bump land 16 serving as a land for receiving a conductor to be electrically connected from above is formed such that, when seen from above, the distance from the center of solder bump land 16 to the outer edge of solder bump land 16 facing an adjacent signal line 12 is shorter than the distance from the center to the outer edge of the land in other areas. The arrangement of other portions is the same as the first embodiment.

The rule for disposition of the interconnection lines dictates that a conductor such as an electrode or an interconnection line, when disposed within the same plane, must be arranged at a certain distance from an outer edge of each interconnection line. Therefore, conventionally, when two solder bump lands 16 were arranged close to one another with their distance being smaller than the certain distance, no interconnection line or only a limited number of interconnection lines could be provided in the gap. According to the present embodiment, however, solder bump land 16 is partially cut away so that the necessary distance from an interconnection line can be procured. As a result, the higher density of the interconnection lines can be achieved and the miniaturization of the overall semiconductor device becomes possible.

Moreover, in a structure in which a solder resist (not shown) is provided on an upper surface of the layer in which a solder bump land 16 resides but not in the area to which a solder bump 105 is to be connected to leave the area open, if solder bump land 16 is formed such that it is cut away in a portion covered by the solder resist, the contact area between solder bump land 16 and solder bump 105 is not affected and no degradation in the reliability occurs.

Figure 8:
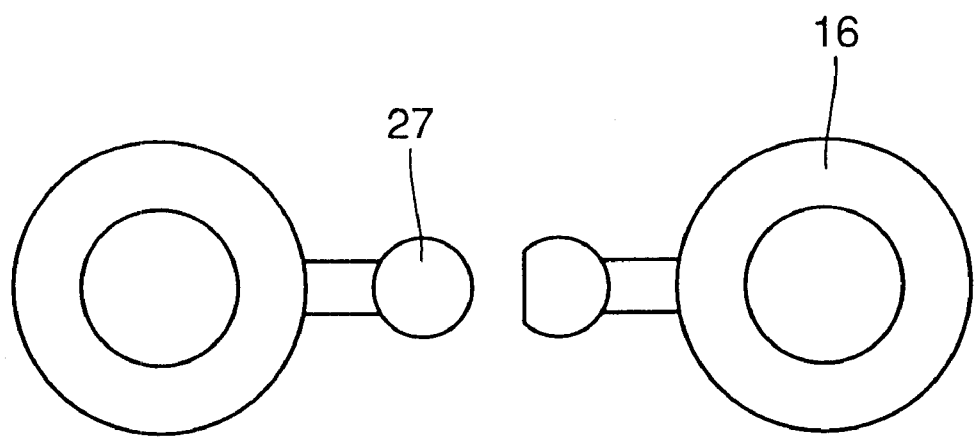
Figure 9:
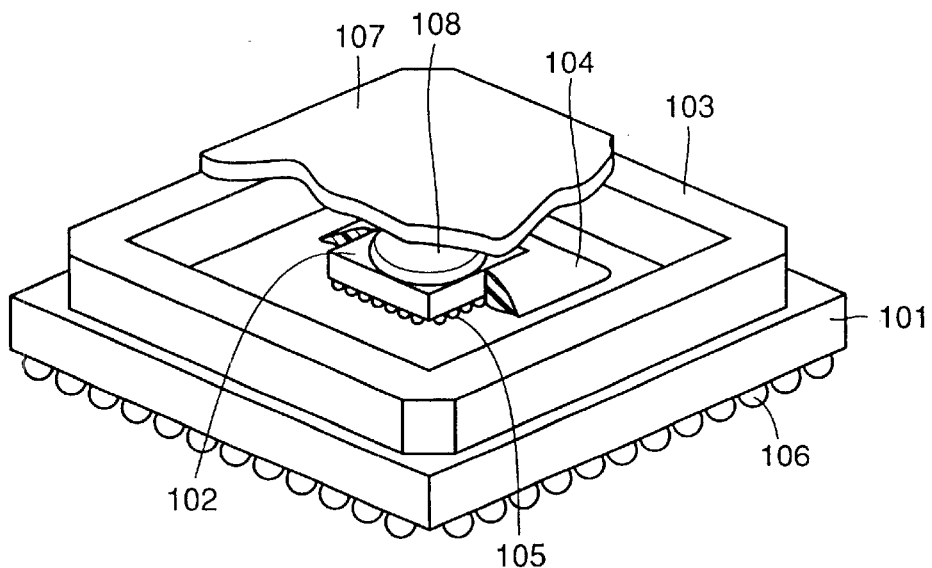
FIG. 9 is a perspective view of a conventional FCBGA substrate module.
Figure 10:
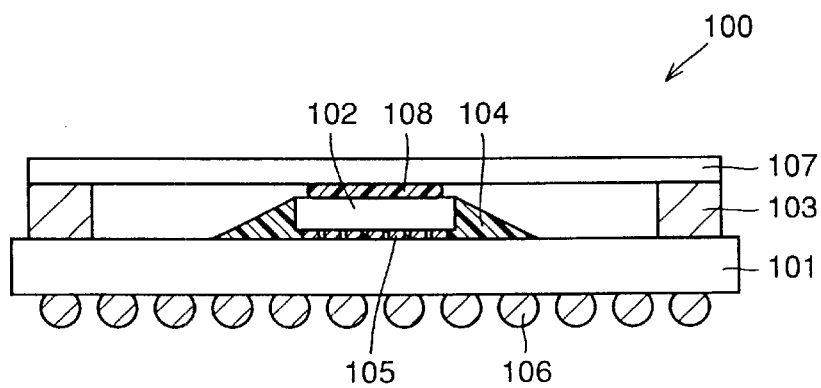
FIG. 10 is a cross sectional view of the conventional FCBGA substrate module.
Figure 11:
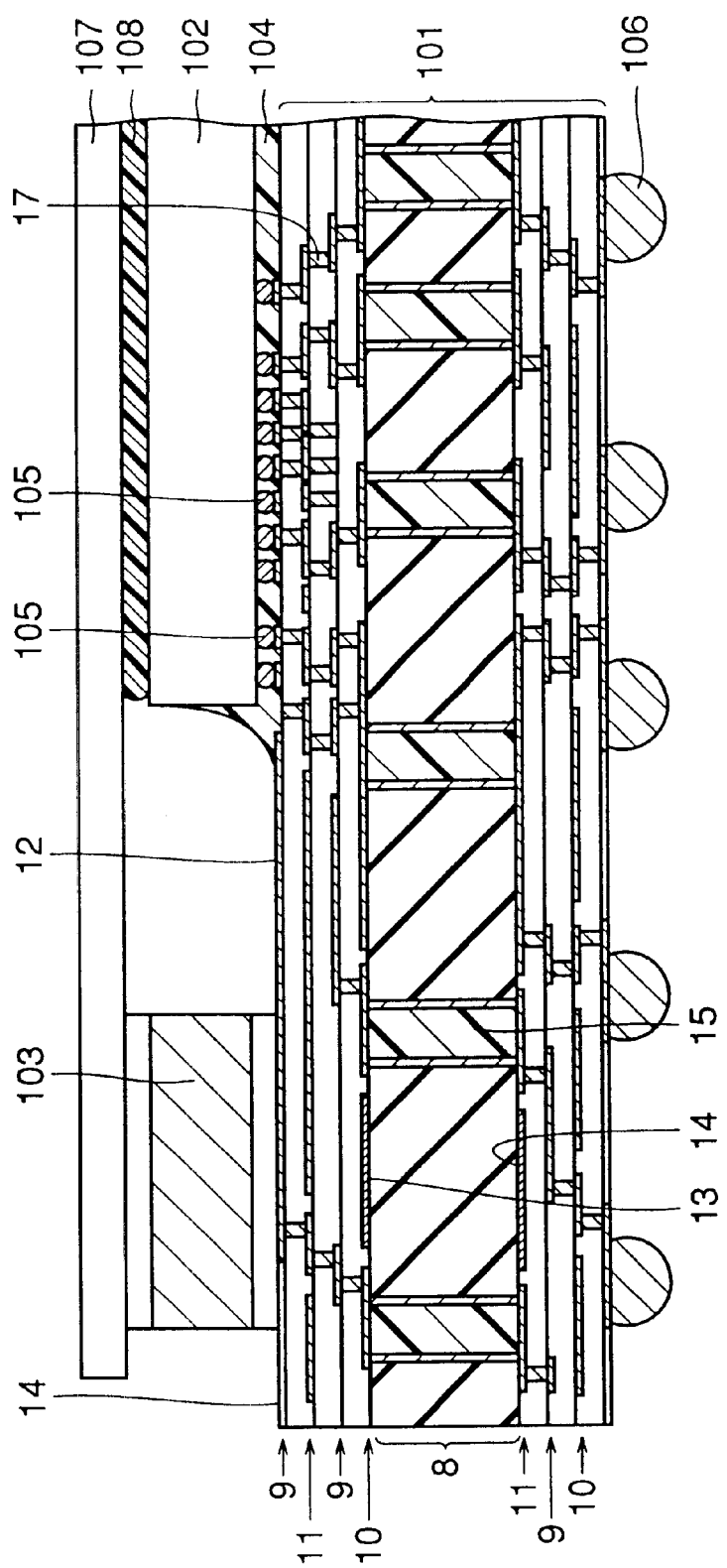
FIG. 11 is a cross sectional view of a portion of the conventional FCBGA substrate module.

Furthermore, as shown in FIG. 8, a via land 27 instead of solder bump land 16 may be formed with a partially cut away shape, thereby achieving a higher density in arranging via holes 17 and signal lines 12 in each component layer.

According to the present invention, signal lines of the first specific signal layer are led to the lower multi-layer portion via through holes selected under certain conditions so that the crosstalk noise does not become a problem even when the second specific signal layer is superposed on the first specific signal layer without providing a plane layer therebetween. In addition, a plane is provided in the region of the first specific signal layer lacking signal lines so that the second specific signal layer is sandwiched by the planes and thus forms the strip structure without a separate plane layer being provided between the first specific signal layer and the second specific signal layer. Thus, the plane layer conventionally required between the first specific signal layer and the second specific signal layer becomes unnecessary, and thus the number of layers required for the multi-layer substrate is reduced. Consequently, a semiconductor device having a fewer number of layers while having the same arrangement of signal-related solder bumps as the conventional example can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device provided with a multi-layer substrate, a semiconductor chip provided above said multi-layer substrate, and external connection electrodes provided below said multi-layer substrate, wherein said multi-layer substrate includes:

a core layer having a plurality of through holes for electrically connecting an upper side with a lower side;

an upper multi-layer portion provided above said core layer;

a lower multi-layer portion provided below said core layer;

a plurality of chip electrode lands provided on an upper surface of said upper multi-layer portion for electrically connecting to electrodes of said semiconductor chip; and a plurality of signal lines for electrically connecting said chip electrode lands respectively to said external connection electrodes, wherein said upper multi-layer portion and said lower multi-layer portion are each formed by a plurality of component layers and include via holes for electrically connecting said signal lines belonging to different ones of said component layers, said plurality of component layers include a signal layer provided mainly for routing of said signal lines to desired positions in plan view within each same layer, and plane layers provided mainly for disposing conductor planes that sandwich said signal layer, said signal layer in said upper multi-layer portion includes a first specific signal layer and a second specific signal layer provided under said first specific signal layer without providing one of said plane layers therebetween, said signal lines extending from within a projected region of said semiconductor chip toward outside the region in said first specific signal layer are routed to said via holes connected to said through holes respectively selected from among all said through holes such that a distance of longest signal line of all said signal lines routed within said first specific signal layer becomes the shortest possible, and are connected to said lower multi-layer portion via said through holes, and are further routed in said lower multi-layer portion to said via holes leading to said external connection electrodes to which said signal lines are to be connected, said signal lines extending from within the projected region of said semiconductor chip toward outside the region in said second specific signal layer are routed to said via holes leading to said through holes substantially closest, when seen from above, to said external connection electrodes to which said signal lines are to be connected, and are connected to said lower multi layer portion via said through holes, and a conductor plane is disposed in a region other than a portion in which said signal lines are disposed in said first specific signal layer.

2. The semiconductor device according to claim 1, wherein said first specific signal layer is said component layer which is uppermost in said upper multi-layer portion.

3. The semiconductor device according to claim 1, further comprising an external terminal land for electrically connecting to said plane, wherein connection between said plane and said external terminal land is provided in parallel via a plurality of via holes.

4. A semiconductor device provided with a multi-layer substrate, a semiconductor chip provided above said multi-layer substrate, and external connection electrodes provided below said multi-layer substrate, wherein said multi-layer substrate includes:

a core layer having a plurality of through holes for electrically connecting an upper side with a lower side;

an upper multi-layer portion provided above said core layer;

a lower multi-layer portion provided below said core layer;

a plurality of chip electrode lands provided on an upper surface of said upper multi-layer portion for electrically connecting to electrodes of said semiconductor chip; and a plurality of signal lines for electrically connecting said chip electrode lands respectively to said external connection electrodes, wherein said upper multi-layer portion and said lower multi-layer portion are each formed by a plurality of component layers and include via holes for electrically connecting said signal lines belonging to different ones of said component layers, and a land for receiving a conductor to which an electrical connection is provided from above is formed such that, when seen from above, the distance between a center of a circle circumscribed about said land and an outer edge of said land facing an adjacent interconnection line is shorter than the distance between said center and an outer edge of said land in other areas.

5. The semiconductor device according to claim 4, wherein said land is said chip electrode land.

6. The semiconductor device according to claim 4, wherein said land is a via land serving as a receiving portion for a via hole.

* * * * *